United States Patent
Eliaz et al.

(10) Patent No.: US 11,777,539 B2
(45) Date of Patent: Oct. 3, 2023

(54) RATE CONTROL WITH TRANSMITTER POWER OPTIMIZATION

(71) Applicant: Avago Technologies International Sales Pte. Limited, Singapore (SG)

(72) Inventors: Amir Dov Eliaz, Savyon (IL); Nir Stahl Diskin, Tel-Aviv (IL); Daniel Stopler, Holon (IL); Rohit Gaikwad, San Diego, CA (US); Vinko Erceg, Carlsbad, CA (US); Peyush Agarwal, Pleasanton, CA (US); Rana A. Abdelaal, San Jose, CA (US); Hyoung Keun Ryu, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/669,448

(22) Filed: Oct. 30, 2019

(65) Prior Publication Data

US 2020/0136661 A1 Apr. 30, 2020

Related U.S. Application Data

(60) Provisional application No. 62/753,801, filed on Oct. 31, 2018.

(51) Int. Cl.
*H04B 1/04* (2006.01)
*H04W 52/02* (2009.01)
*H03F 3/24* (2006.01)

(52) U.S. Cl.
CPC .............. *H04B 1/0475* (2013.01); *H03F 3/24* (2013.01); *H04W 52/0261* (2013.01); *H04B 2001/0408* (2013.01)

(58) Field of Classification Search
CPC ......... H04B 1/0475; H04B 2001/0408; H04W 52/0261; H04W 52/04; H04W 28/0242;
(Continued)

(56) References Cited

U.S. PATENT DOCUMENTS

| 8,611,288 B1* | 12/2013 | Zhang | ................. | H04B 7/0619 |
| | | | | 370/329 |
| 2006/0023624 A1* | 2/2006 | Han | ..................... | H04L 1/0026 |
| | | | | 370/204 |

(Continued)

OTHER PUBLICATIONS

A. J. Goldsmith and Soon-Ghee Chua, "Variable-rate variable-power MQAM for fading channels," in IEEE Transactions on Communications, vol. 45, No. 10, pp. 1218-1230, Oct. 1997, doi: 10.1109/26.634685. (Year: 1997).*

(Continued)

*Primary Examiner* — Sam K Ahn
*Assistant Examiner* — Amneet Singh
(74) *Attorney, Agent, or Firm* — Foley & Lardner LLP (57) ABSTRACT

A transmit power optimization and rate-control system includes a transmitter circuit having one or more power amplifiers transmit radio-frequency (RF) signals at a transmission (Tx) rate and a Tx power level. A receiver circuit receives RF signals, decodes the received RF signals and provides one or more Tx status feedbacks. A rate-control module adjusts the Tx rate based at least on a channel condition. A probing engine generates at least two consecutive frames at a first Tx power level, and a second Tx power level in response to a trigger causes the transmitter to transmit the at least two consecutive frames, and processes respective Tx status feedbacks received in response to transmission of the two consecutive frames in order to optimize the Tx power of the transmitter.

21 Claims, 10 Drawing Sheets

(58) Field of Classification Search
CPC ....... H04W 24/08; H04W 28/048; H03F 3/24; Y02D 30/70; H04L 1/1607
See application file for complete search history.

(56) References Cited

U.S. PATENT DOCUMENTS

| | | | |
|---|---|---|---|
| 2006/0114836 A1* | 6/2006 | Pollin | H04L 1/24 370/252 |
| 2010/0260288 A1* | 10/2010 | Aoki | H04B 7/0452 375/296 |
| 2012/0033575 A1* | 2/2012 | Zhang | H04L 25/03949 370/252 |
| 2015/0036729 A1* | 2/2015 | Olgaard | H04B 17/29 375/224 |
| 2018/0092048 A1* | 3/2018 | Cheng | H04B 17/13 |
| 2018/0288711 A1* | 10/2018 | Lagerqvist | H04W 52/262 |
| 2018/0332540 A1* | 11/2018 | Lou | H04W 74/006 |
| 2020/0169962 A1* | 5/2020 | Fakoorian | H04L 27/22 |

OTHER PUBLICATIONS

M. Nikodem, M. Slabicki, T. Surmacz and B. Wojciechowski, "Transmission power control based on packet reception rate," 2014 6th International Conference on New Technologies, Mobility and Security (NTMS), 2014, pp. 1-4, doi: 10.1109/NTMS.2014. 6814057. (Year: 2014).*

F. Zou, X. Zhang, X. Gao, D. Shi and E. Wang, "Load Balance Routing using Packet Success Rate for Mobile Ad Hoc Networks," 2007 International Conference on Wireless Communications, Networking and Mobile Computing, 2007, pp. 1624-1627, doi: 10.1109/WICOM.2007.409. (Year: 2007).*

* cited by examiner

RATE CONTROL WITH TRANSMITTER POWER OPTIMIZATION

CROSS-REFERENCE TO RELATED APPLICATIONS

This application claims the benefit of priority under 35 U.S.C. § 119 from U.S. Provisional Patent Application 62/753,801, filed Oct. 31, 2018, which is incorporated herein by reference in its entirety.

TECHNICAL FIELD

The present description relates in general to wireless communication systems, including rate control with transmitter power optimization.

BACKGROUND

Wireless local area network (WLAN) devices are deployed in diverse environments. These environments are generally characterized by the existence of access points (APs) and nonaccess point stations. Next generation WLAN devices are expected to improve performance in dense deployments where many clients and APs are packed in a given area, which may be an indoor and/or outdoor area with a high density of devices, such as train stations, airports, stadiums, buildings, shopping malls, arenas, convention centers, colleges and downtown city centers.

WLAN transceivers use one or more power amplifier (PA) stages to amplify transmit (Tx) signals. In wireless transmitters, transmit power of the PA can be limited by the PA distortion represented by an error-vector magnitude (EVM) parameter. In high data rates, a tight EVM may result in a large backoff power (low transmit power), which is bound to increase as the data rate increases. Additionally, in wireless receivers, the receiver sensitivity degrades at high rates. Therefore, the link budget can significantly reduce as the data rate increases. Moreover, the transmit power is further backed off because of hardware (HW) inaccuracy and parameter uncertainties due to the integrated circuit (IC) fabrication process variations. Consequently, the use of high data rates would be restricted to short-range transmissions.

BRIEF DESCRIPTION OF THE DRAWINGS

Certain features of the subject technology are set forth in the appended claims. However, for purposes of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

The subject technology relates to methods and systems for data rate control with transmitter power optimization. The subject disclosure utilizes a closed loop based on a receiver-side feedback to the transmitter to enable Tx power optimization of the power amplifier (PA). Leveraging the receiver's feedback, the transmitter would be able to operate at around an optimal antenna power, which optimizes signal-plus-noise and distortion (SINAD) by establishing a balance between the nonlinearity distortion and the receiver's signal-to-noise-ratio (SNR). The adjustment of the Tx rate and the Tx power optimization are achieved by limiting error vector magnitude (EVM) and maximizing a link throughput. The potential gain consists of the total power backoff margin taken in the transmitter, such as (a) transmit (Tx) power-control inaccuracy due to hardware (HW) limitations, which is typically about +/−1.5 dB; (b) insertion-loss variation in the path from the PA output to the antenna (e.g., conductor traces, filters, a multiband duplexer, cables and connectors) that can impact the actual PA backoff by about +/−0.5 dB; (c) saturation power ($P_{SAT}$) variation of PA components including transistors or variations of the supply voltage that can be about +/−0.5 dB; and (d) voltage standing-wave ratio (VSWR) due to user's body proximity to the antenna, which can amount to about +/−1 dB. Additionally, beamforming can suppress the EVM by the array gain, expressed as 10 $\log_{10}(N_{TX}/N_{SS})$, where $N_{TX}$ represents the number of Tx antennas and $N_{SS}$ represents the number of independent spatial streams of data. This reduction in EVM allows a Tx power increase of about 1.5 dB for $N_{TX}=4$ and $N_{SS}=2$ or $N_{TX}=2$ and $N_{SS}=1$ (depending on channel condition). In summary, about 4-5 dB can be gained by using a closed-loop system at medium to high data rate where spectral mask is not limiting.

The benefits include, but are not limited to, an increase in throughput and power-consumption savings for handset in downlink and uplink transmission. For a downlink reception, the receiver has less active time due to the higher communication rate (also in peer-to-peer communications). For an uplink transmission, there is an increase in Tx power, due to PA's power consumption needed to support a higher rate, which is compensated by the less active time. At higher rates, the backoff is relatively high and the PA's power consumption is flat compared to Tx power. In the present disclosure, the term "Tx" may refer to transmitting, transmit, transmitted, transmitter or the like; and the term "Rx" may refer to receiving, receive, received, receiver or the like.

Figure 1:
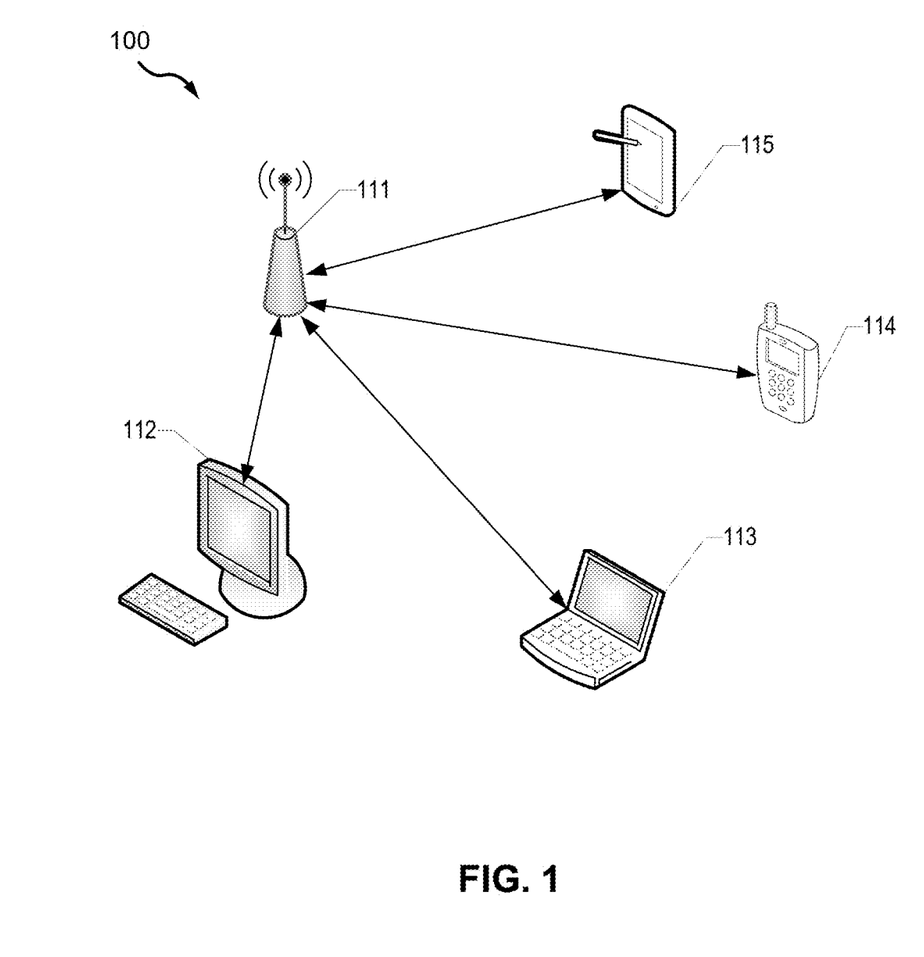
FIG. 1 illustrates an example wireless communication environment in which data rate control with transmitter power optimization of the subject technology may be implemented.

FIG. 1 illustrates an example wireless communication environment in which data rate control with transmitter power optimization of the subject technology may be implemented. In the wireless communication network 100, such as a wireless local area network (WLAN), a basic service set (BSS) includes a plurality of wireless communication devices (e.g., WLAN devices). In one aspect, a BSS refers to a set of stations (STAs) that can communicate in synchronization, rather than a concept indicating a particular area. In this example, the wireless communication network 100 includes wireless communication devices 111-115, which may be referred to as STAs. Each of the wireless communication devices 111-115 includes a radio-frequency (RF) transmitter and an RF receiver. The RF transmitter converts the symbols into an RF signal and transmits the RF signal via an antenna. The RF receiver receives an RF signal via the antenna and converts the RF signal into one or more symbols for processing.

Each of the wireless communication devices 111-115 may include a medium access control (MAC) layer and a physical (PHY) layer according to an Institute of Electrical and Electronics Engineers (IEEE) 802.11 standard. In this example, at least one wireless communication device (e.g., device 111) is an access point (AP). An AP may be referred to as an AP STA or an AP device. The other wireless communication devices (e.g., devices 112-115) may be non-AP STAs. Alternatively, all of the wireless communication devices 111-115 may be non-AP STAs in an ad hoc networking environment.

AP STAs and non-AP STAs may be collectively called STAs. However, for simplicity of description, in some aspect only a non-AP STA may be referred to as an STA. An AP may be, for example, a centralized controller, a base station (BS), a node-B, a base transceiver system (BTS), a site controller, a network adapter, a network interface card (NIC), a router, or the like. A non-AP STA (e.g., a client device operable by a user) may be, for example, a device with wireless communication capability, a terminal, a wireless transmit/receive unit (WTRU), user equipment (UE), a mobile station (MS), a mobile terminal, a mobile subscriber unit, a laptop, a non-mobile computing device (e.g., a desktop computer with wireless communication capability) or the like. In one or more aspects, a non-AP STA may act as an AP (e.g., a wireless hotspot).

In one aspect, an AP is a functional entity for providing access to a distribution system, by way of a wireless medium, for an associated STA. For example, an AP may provide access to the internet for one or more STAs that are wirelessly and communicatively connected to the AP. In FIG. 1, wireless communications between non-AP STAs are made by way of an AP. However, when a direct link is established between non-AP STAs, the STAs can communicate directly with each other (without using an AP). The RF transmitter of each of the wireless communication devices 111-115 includes a PA that can include features of the subject technology, including data rate control with transmitter power optimization, as discussed in more detail herein.

Figure 2:
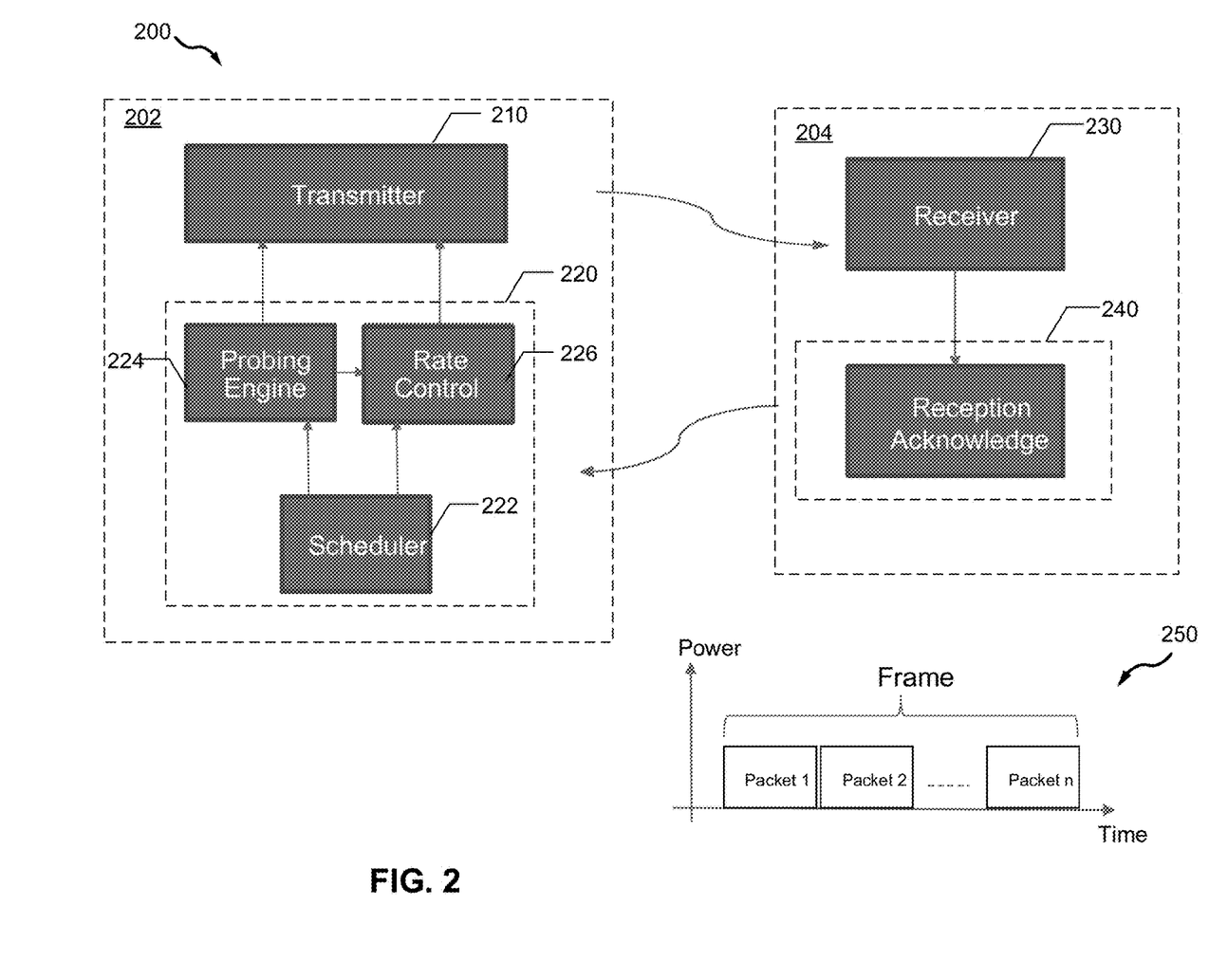
FIG. 2 illustrates a block diagram of examples of a wireless communication system featuring data rate control with transmitter power optimization and a chart depicting structure of a probing frame, in accordance with one or more implementations of the subject technology.

FIG. 2 illustrates a block diagram of examples of a wireless communication system 200 featuring data rate control with transmitter power optimization and a chart 250 depicting structure of a probing frame, in accordance with one or more implementations of the subject technology. The wireless communication system 200 includes a first wireless transceiver 202 and a second wireless transceiver 204. The first wireless transceiver 202 includes a first transmitter 210, a first receiver (not shown for simplicity) and a first block 220. The second wireless transceiver 204 includes a second receiver 230, a second transmitter (similar to 210 and not shown for simplicity) and a second block 240. The first transmitter 210 consists of known circuitry, for example, including but not limited to an encoder, a modulator, a digital-to-analog converter (DAC), a local oscillator (LO) generator, an upconverter, filters and one or more PAs. The second receiver 230 consists of known circuitry, for example, including but not limited to a low-noise amplifier (LNA), an LO generator, a down converter, filters, one or more variable gain amplifiers (VGAs), an analog-to-digital converter (ADC), a demodulator and a decoder.

Features of the subject technology including, data rate control with transmitter power optimization, are implemented by the first block 220 and the second block 240. The first block 220 can be incorporated into the first transmitter 210 or the first receiver (not shown) of the first wireless transceiver 202, although it is shown as a separate block. The second block 240 can be part of the second transmitter (not shown) or the second receiver 230 of the second wireless transceiver 204. In some implementations, the first block 220 and the second block 240 can be realized, at least partially, in hardware, firmware or software. In one or more implementations, the software portions of the first block 220 and/or the second block 240 can be executed by a processor of a host device such as an electronic device, for example, a handheld communication device.

The first block 220 includes a scheduler module 222, a probing engine 224 and a rate-control module 226. The second block 240 is a reception-acknowledge module. Before describing the Tx power optimization and transmission rate control of the subject technology, the existing rate-control schemes are briefly explained below.

The rate-control schemes implemented by the existing communication systems dynamically adapt the transmission rate to channel conditions. These rate-control schemes operate at the highest throughput according to the channel condition based on the receiver's feedback. The feedback can be based on an acknowledgment (ACK) signal of a successful frame decoding or by other demodulator metrics such as estimated SNR values. Transmit power optimization of the existing communication systems can be based on similar feedback and metrics. For example, the first transmitter 210 transmits data in the form of a number of data frames. The second receiver 230 receives and decodes the data frames transmitted by the first transmitter 210 and determines whether the data frames are valid and are received successfully. In response, if the data frames are received successfully, the second receiver 230 causes the reception-acknowledge module 240 to prepare ACK frames, including information regarding the received data frames, for transmission to the first wireless transceiver 202. The first receiver of the first wireless transceiver 202 receives the ACK frames and causes the rate-control module 226 to analyze the ACK frames and to update the transmission rate of the first transmitter 210. In some aspects, the rate-control module 226 is configured to determine the updated Tx rate based on the channel condition and an updated Tx power. In some aspects, the second receiver 230 generates a metric value for a link-budget gain based on the Tx power optimization. This metric can be used to check whether the transmitter is capable of supporting the Tx power optimization and to enable a distortion recovery receiver (DRR) technique. The subject technology implements Tx power optimization and transmitter rate control based on a probing scheme as described in more detail herein.

A similar approach of probing is used to determine a number of spatial streams ($N_{SS}$) and short-guard interval (SGI). There is no impact on existing rate control, meaning the rate control would not be aware of Tx power probing but senses it and uses the power gain to select a higher rate. Tx power probing is an add-on to the existing rate control. In this regard, the subject technology is transmitter-centric and no changes are needed at the receiver side.

In one or more aspects, the probing scheme of the subject technology starts by the scheduler module 222 triggering the probing engine 224 for a predefined number of frames with a temporary power level. The probing engine 224 causes the first transmitter 210 to transmit the predefined number of probing frames at the temporary power level. Each probing frame can include a number of (n) probing packets that are transmitted sequentially, as shown in the chart 250. The second receiver 230 receives and decodes the probing frames and causes the reception-acknowledge module 240 to prepare ACK packets in response to successful reception of the probing frames for transmission to the first wireless transceiver 202. The first wireless transceiver 202 receives the ACK packets and causes the probing engine 224 to analyze the information in the ACK packets. The probing engine 224 updates transmission power level for the next data frame by the first transmitter 210.

Figure 3:
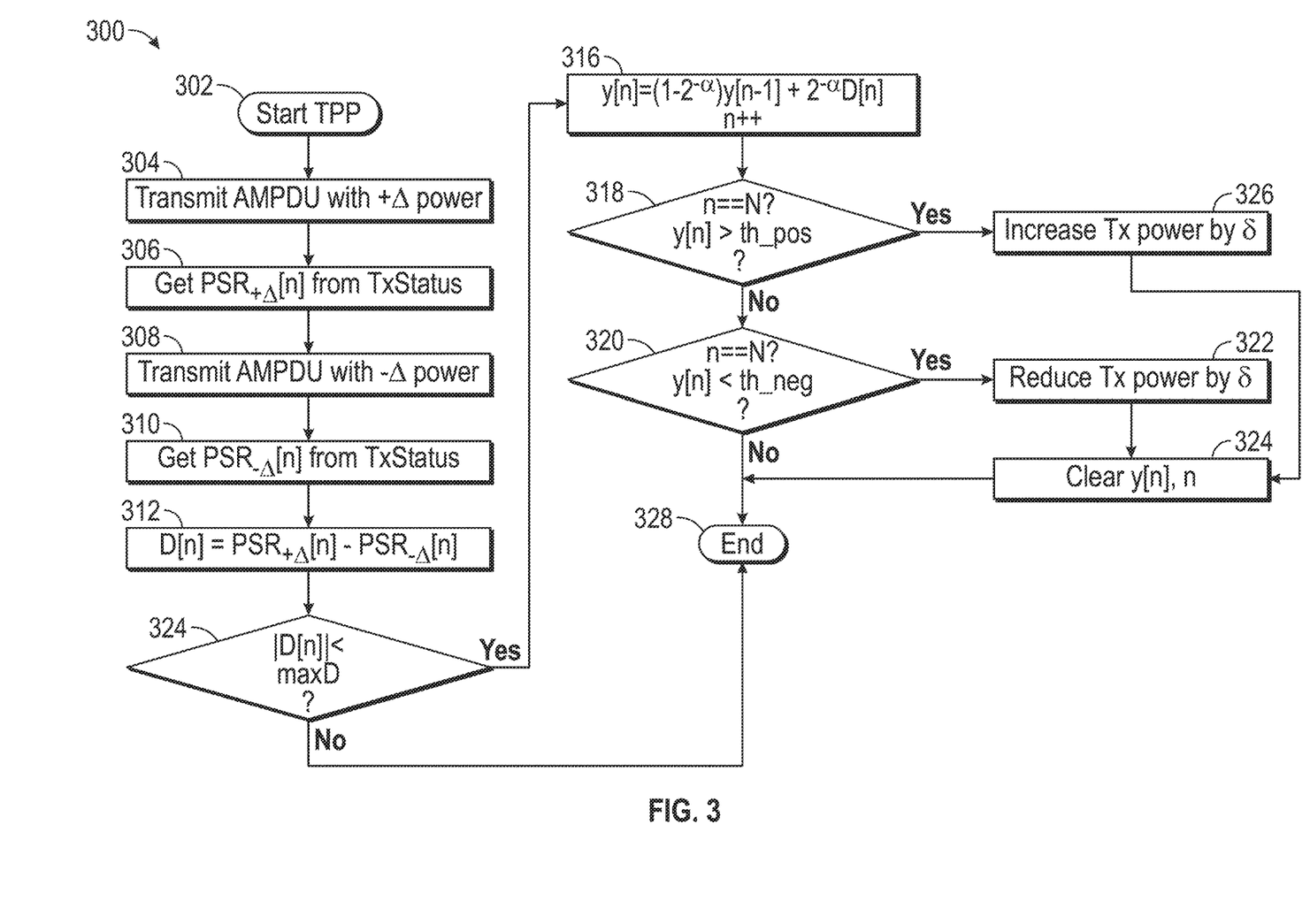
FIG. 3 is a flow diagram illustrating an example process of transmitter power optimization, in accordance with one or more implementations of the subject technology.

FIG. 3 is a flow diagram illustrating an example process 300 of transmitter power optimization, in accordance with one or more implementations of the subject technology. The process 300 starts at operation block 302, where Tx power probing (TPP) is triggered. At operation block 304, the transmitter (e.g., 210 of FIG. 2) transmits a first probing frame (referred to as a +Δ frame) with a power level having a delta (Δ) increment (e.g., +0.5 dB) relative to the current power level. The +Δ frame is coupled with an aggregated MAC protocol data unit (AMPDU) (resulting in an $AMPDU_{+\Delta}$). At operation block 306, the probing engine (e.g., 224 of FIG. 2) receives a first TxStatus frame from the receiver (e.g., 230 of FIG. 2) and retrieves a corresponding packet success rate (PSR) denoted herein by $PSR_{+\Delta}[n]$ from the ACK signal placed in the first TxStatus frame. At operation block 308, the transmitter transmits a second probing frame (referred to as a −Δ frame) with a power level having a Δ decrement (e.g., −0.5 dB) relative to the current power level and is coupled to an AMPDU (resulting in an $AMPDU_{-\Delta}$). An AMPDU is used for the processes and examples described herein. However, AMPDUs represent just one example and the subject technology is not limited to this example. For example, the probing frames may be coupled to Physical Layer Convergence Protocol (PLCP) Protocol Data Units (PPDU) in place of AMPDUs for the processes described herein.

At operation block 310, the probing engine receives a second TxStatus frame from the receiver and retrieves a corresponding PSR denoted herein by $PSR_{-\Delta}[n]$ from the ACK placed in the second TxStatus frame. At operation block 312, the probing engine subtracts $PSR_{-\Delta}[n]$ from the $PSR_{+\Delta}[n]$ to compute a PSR difference, D[n], where n represents the corresponding frame number. At operation block 324, the probing engine compares an absolute value of D[n] (|D[n]|) with a maximum D (max D) value to reject interferences. The value of |D[n]| exceeding max D implies for unreliable D[n] caused by an interference or other fault, and D[n] can be ignored. Thus, if |D[n]| is larger than max D, control is passed to operation block 328, which is an end of the process 300; otherwise, control is passed to operation block 316, where an average over previous power probing, represented by y[n] is computed based on D[n] and a previous value of y[n], namely, y[n−1].

Next, if N probings were accomplished, y[n] is checked with a hysteresis to determine whether to increase or decrease transmit power. The hysteresis with a positive threshold (th_pos) and a negative threshold (th_neg) is applied to further suppress detection noise and to improve Tx power stability. For this, at control operation block 318, it is determined whether n is equal to N and y[n] is greater than th_pos. If the answer is yes, control is passed to operation block 326; otherwise, control is passed to control operation block 320, where it is checked as to whether n is equal to N and y[n] is smaller than th_neg. If the answer is yes, control is passed to operation block 322; otherwise, control is passed to operation block 328, which is the end of the process 300. At operation block 326, the probing engine causes the transmitter to increase the Tx power by a value δ and the control is passed to operation block 324. At operation block 322, the probing engine causes the transmitter to reduce the Tx power by the value δ and the control is passed to operation block 324, where y[n] and n are set to zero and the process 300 ends. For system stability, it is recommended that the power change value δ be smaller than Δ.

Triggering the TPP on the transmitter can be based on a frame counter, a real-time counter or similar modules. The triggering can assert TPP more frequently at convergence and less frequently at steady state. The triggering may be hooked on existing probing (e.g., SGI, $N_{SS}$) or use a decoupled triggering scheme to avoid probing conflict.

The rate control may use filtering to average main PSR (PSR_cur) estimation; therefore the impact of consecutive ±Δ power probing can be absorbed assuming Δ is small (e.g., <1 dB), and the TxStatus corresponding to the $AMPDU_{+\Delta}$ and $AMPDU_{-\Delta}$ can be communicated to the rate-control module (e.g., 226 of FIG. 2) for normal operation. If Δ is not small enough, this assumption may not hold (due to the cliff nature of PSR) and PSR of power probing frames is not communicated to the rate-control module. In this case rate-control convergence time can be affected by the TPP rate.

The rate-control module changes rate from time to time to adapt for channel conditions. When rate is changed the TPP history should be cleared, including n, y[n] and D[n], to avoid PSR projections over rate change. However, the power backoff gain should be projected on the rate change to prevent the system from bouncing over rates. If the system is operating at the modulation and coding scheme (MCS) of order n ($MCS_n$) and the TPP is able to increase Tx power by 3 dB, the rate-control module may exploit the improved link budget to use a higher data rate and a higher-order MCS (e.g., $MCS_{n+1}$). The Tx backoff gain of $MCS_n$ should be reflected to $MCS_{n+1}$ to prevent rate control stepping down to $MCS_n$ due to the low PSR of the lower link budget. When the system chooses a fallback rate, it is advised to use the nominal Tx power rather than the optimized power in order to overcome potential faults of TPP.

In a multiple-user, multiple-input, multiple-output (MU-MIMO) mode, the streams are coupled with different receivers sharing the same Tx power. Each receiver can generate an ACK for a successful frame reception. An instance of TPP can be supported for each user, and the Tx power that can be used can suit the susceptive receiver. Assuming 1-M users are sharing the same frame, each user may be supported by a dedicated $TPP_m$ based on an $ACK_m$, resulting with $D[n]_m$ and $y[n]_m$. The decision to increase Tx power can be based on $\min\{y[n]_m\}$ for $y[n]_m > 0$ and to reduce Tx power on $\max\{y[n]_m\}$ for $y[n]_m < 0$.

The concept of TPP for MU-MIMO can be used to support orthogonal frequency division multiple access (OFDMA) and MU-OFDMA, but in OFDMA, EVM from an adjacent resource unit (RU) can cross-interfere and, thus, the problem becomes more complicated.

When production variation has large errors per Tx path, extending the TPP for each of the Tx paths (antennas) can be considered. A TPP instance can be realized for each antenna controlling the associated transmit power. To avoid probing interferences, each antenna probing should be decoupled and a single-antenna probing process should be done at any given time. It is possible to use a common probing controlling all Tx paths concurrently and separately to use per antenna probing to fine-tune Tx power and in order to maximize the link budget.

The subject technology complies with IEEE 802.11 and there is no need for capability announcement. During the Tx power optimization, the EVM may exceed the standard 802.11 values, but a new specification change excludes beamforming from EVM compliance test, which allows this feature (relaxed EVM is possible for optimal link performance).

In some aspects, the Tx power optimization of the subject technology is based on the receiver's ACK and cooperates with the existing rate control. Existing rate control would not be aware of Tx power optimization but exploits the increased link budget. Future feedback (e.g., specified in IEEE 802.11ax) based on inner-loop metrics such as SNR, and other soft metrics at demodulator input, are optional for Tx power optimization.

Figure 4:
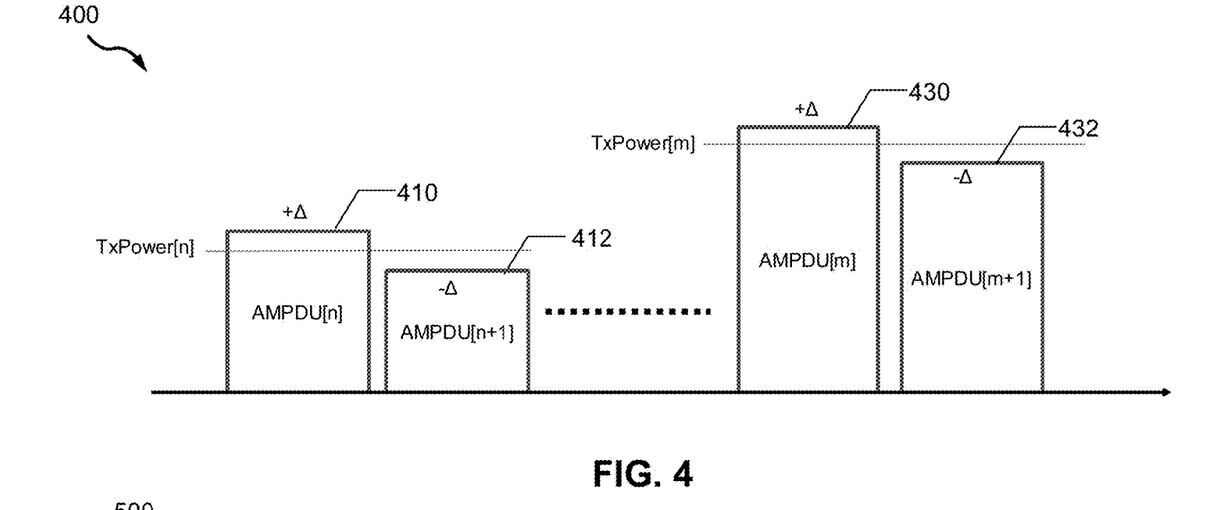
FIG. 4 is a time diagram conceptually illustrating an example of a frame sequence for transmit (Tx) power optimization, in accordance with one or more implementations of the subject technology.

FIG. 4 is a time diagram conceptually illustrating an example of a frame sequence 400 for Tx power optimization, in accordance with one or more implementations of the subject technology. The frame sequence 400 includes a number of frames including frames 410, 412, 430 and 432. The frames 410 and 412 are AMPDU[n] and AMPDU[n+1] for power probing at time n with increased (+Δ) and reduced (−Δ) power levels compared to the Tx power[n] level. The frames 430 and 432 are AMPDU[m] and AMPDU[m+1] for power probing at a time m with increased (+Δ) and reduced (−Δ) power levels compared to the Tx power[m] level. It is imperative that the frames 410 ($AMPDU_{+\Delta}$) and 412 ($AMPDU_{-\Delta}$) be consecutive (as shown) to share similar channel conditions needed to discriminate the Tx power. If $AMPDU_{+\Delta}$ and $AMPDU_{-\Delta}$ are far in time, the channel may vary and the power probing might be unreliable. However, the next power probing at time m can be far in time as long as $AMPDU_{+\Delta}$ and $AMPDU_{-\Delta}$ at time m (frame 430 and frame 432, respectively) are kept consecutive.

Figure 5:
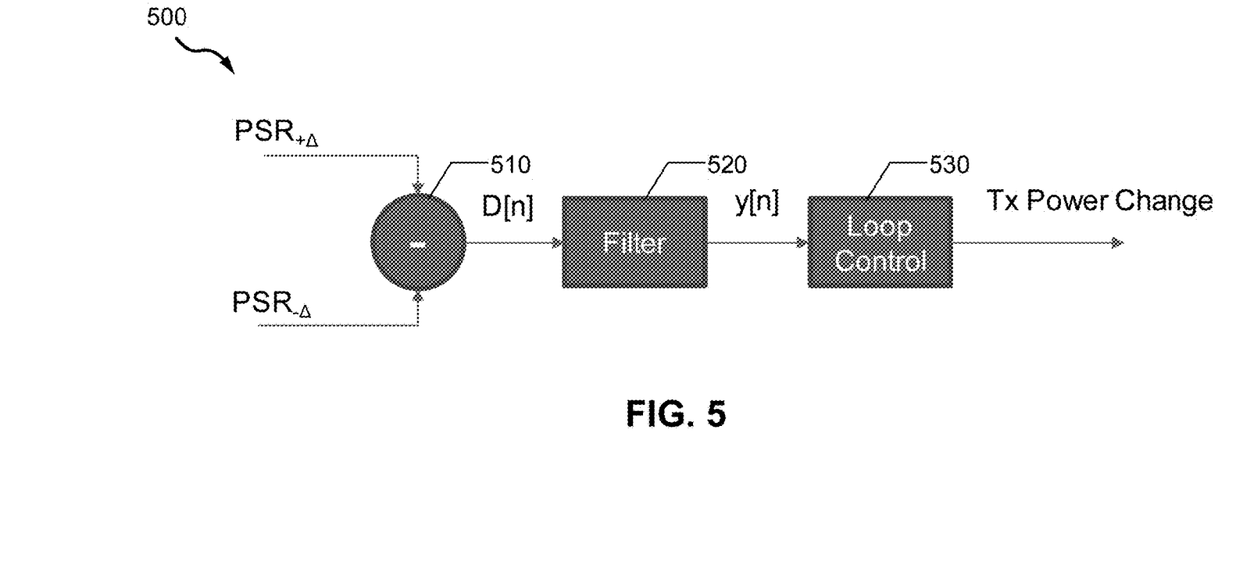
FIG. 5 is a block diagram illustrating an example Tx probing detector, in accordance with one or more implementations of the subject technology.

FIG. 5 is a block diagram illustrating an example Tx probing detector 500, in accordance with one or more implementations of the subject technology. The Tx probing detector 500 performs power-level discrimination and includes a subtraction module 510, a filter 520 and a loop-control 530. The subtraction module 510 subtracts $PSR_{-\Delta}$ from $PSR_{+\Delta}$ to form the PSR difference, D[n], associated with ±Δ frames transmissions. The PSR difference D[n] serves as the detector for the transmit power. At the optimal power level, D[n] can be zero, indicating that increasing the Tx power may result in an excessive EVM and reducing the Tx power may result in a poor SNR. The filter 520 is applied to D[n] to generate a smooth and stable detection function y[n]. In some implementations, the filter 520 can be an infinite impulse response (IIR) filter, although a finite impulse response (FIR) can also be used. The detection function y[n] is used by the loop-control 530 to produce Tx power changes. The power-level discrimination performed by the Tx probing detector 500 is seamless to the rate control and has minor impact to rate-control sensing.

Figure 6:
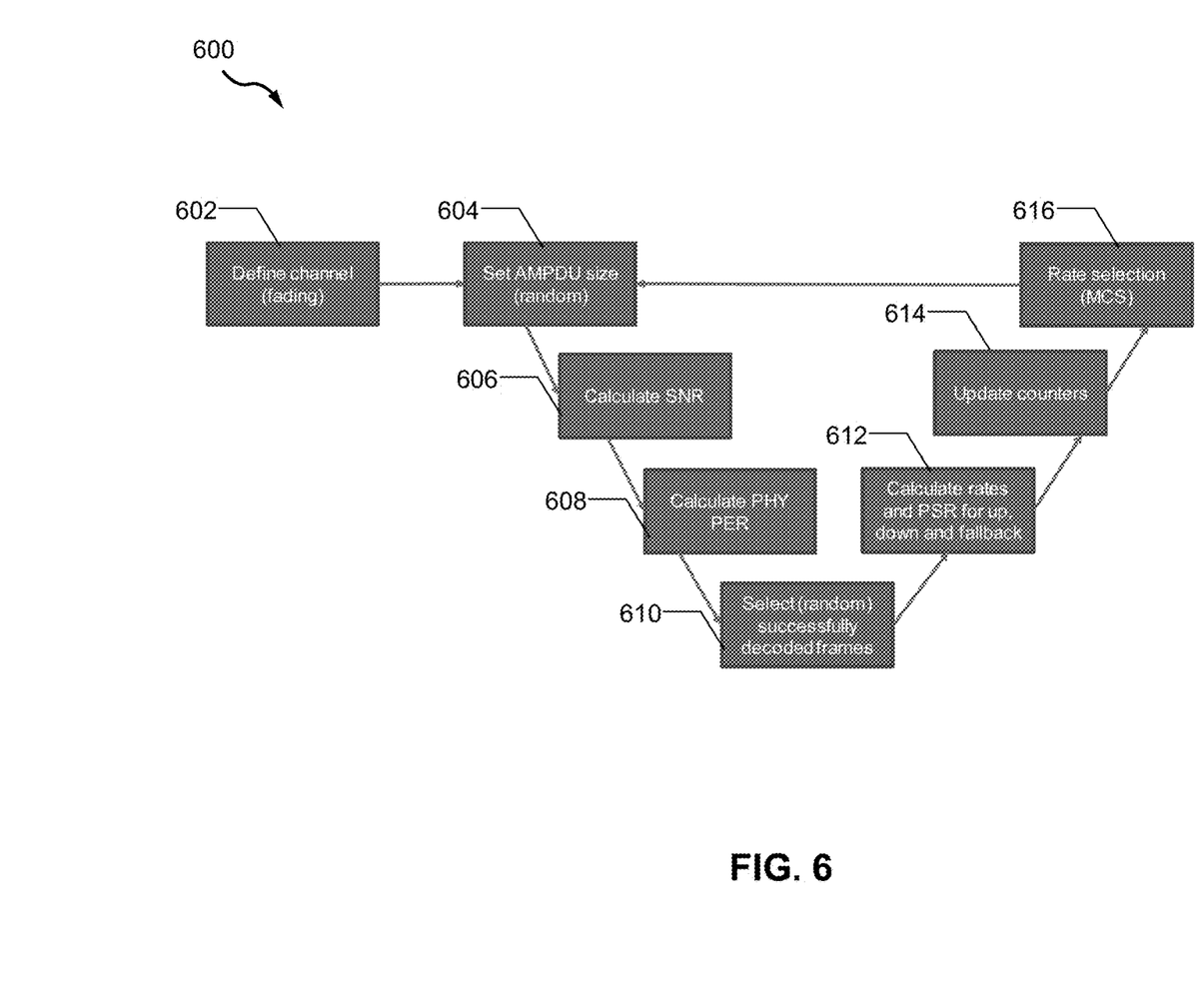
FIG. 6 is a flow diagram illustrating an example simulating process for data rate control with transmitter power optimization, in accordance with one or more implementations of the subject technology.

FIG. 6 is a flow diagram illustrating an example simulating process 600 for data rate control with transmitter power optimization, in accordance with one or more implementations of the subject technology. The simulating process 600 is a rate-adaptation simulation that is based on a PHY abstraction layer. The PHY performance (packet error rate (PER) vs. SNR) is simulated using configurable functions with a typical 2 dB margin from $PER=10^{-1}$ to $PER=10^{-2}$. The channel type can be selected from fixed, sloped or Rayleigh (flat) types with configurable coherency constant.

The simulating process 600 starts at step 602, where channel (fading) is defined. Next, at step 604, AMPDU size is set using a random generator. At step 606, the SNR is computed based on the defined channel. At step 608, the PHY PER is determined based on the defined channel. At step 610, a number of successfully decoded frames are randomly selected. At step 610, the rates and PSR for power-up, power-down and fallback level are determined, and, at step 612, PSR counters are updated. Finally, at step 616, the rate and a corresponding MCS are selected and reported to the step 604.

The Tx power optimization includes PA nonlinearity impact on EVM. The rates and MCS used are based on very high throughput (VHT) wireless protocols.

Figure 7:
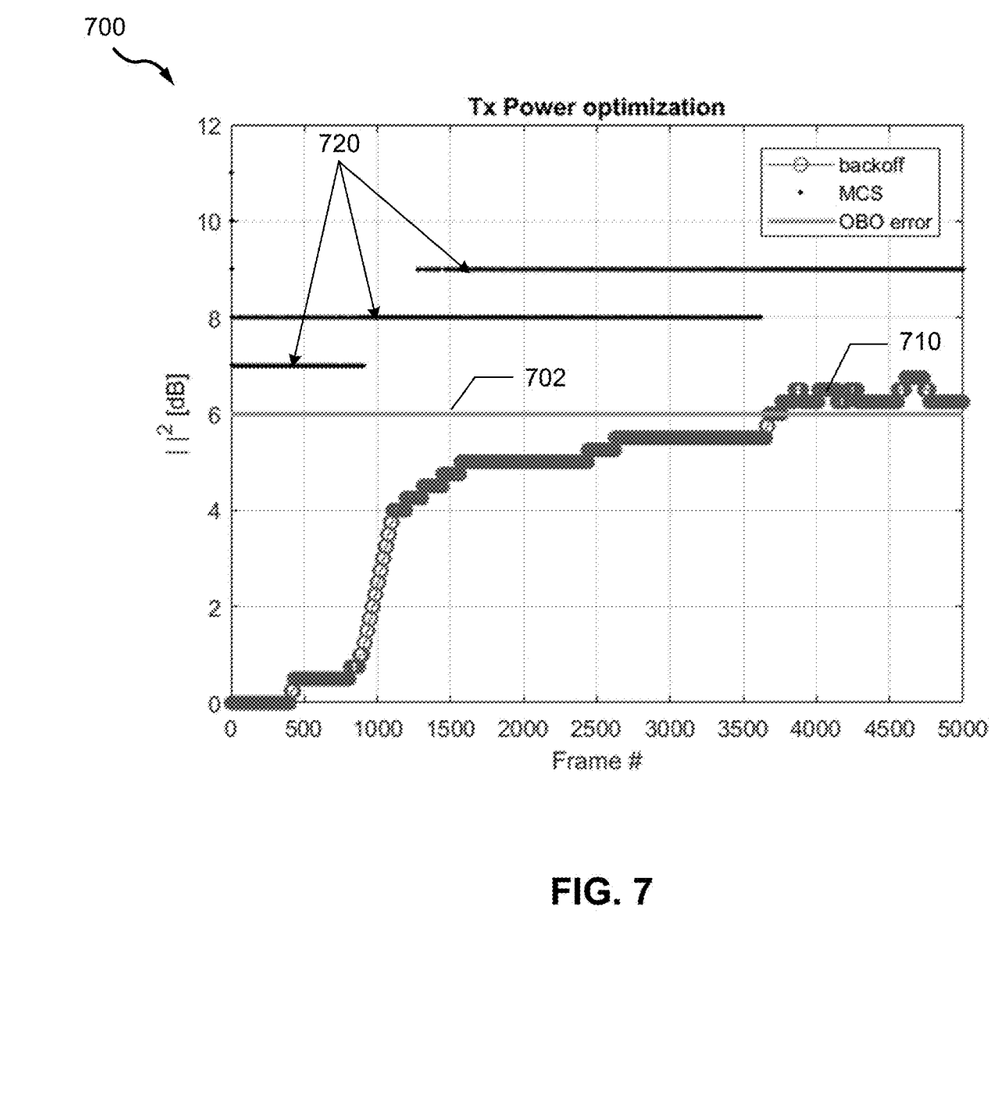
FIG. 7 is a chart illustrating an example simulation result on Tx power optimization based on a fixed channel, in accordance with one or more implementations of the subject technology.

FIG. 7 is a chart illustrating an example simulation result 700 on Tx power optimization based on a fixed channel, in accordance with one or more implementations of the subject technology. The example simulation result 700 includes a plot 710 of the power backoff versus frame number. Also shown are an initial output backoff (OBO) error 702 at about 6 dB and MCS values 720. The system boosts from MCS7 to MCS9 and the backoff converges to the 6 dB error level.

Figure 8:
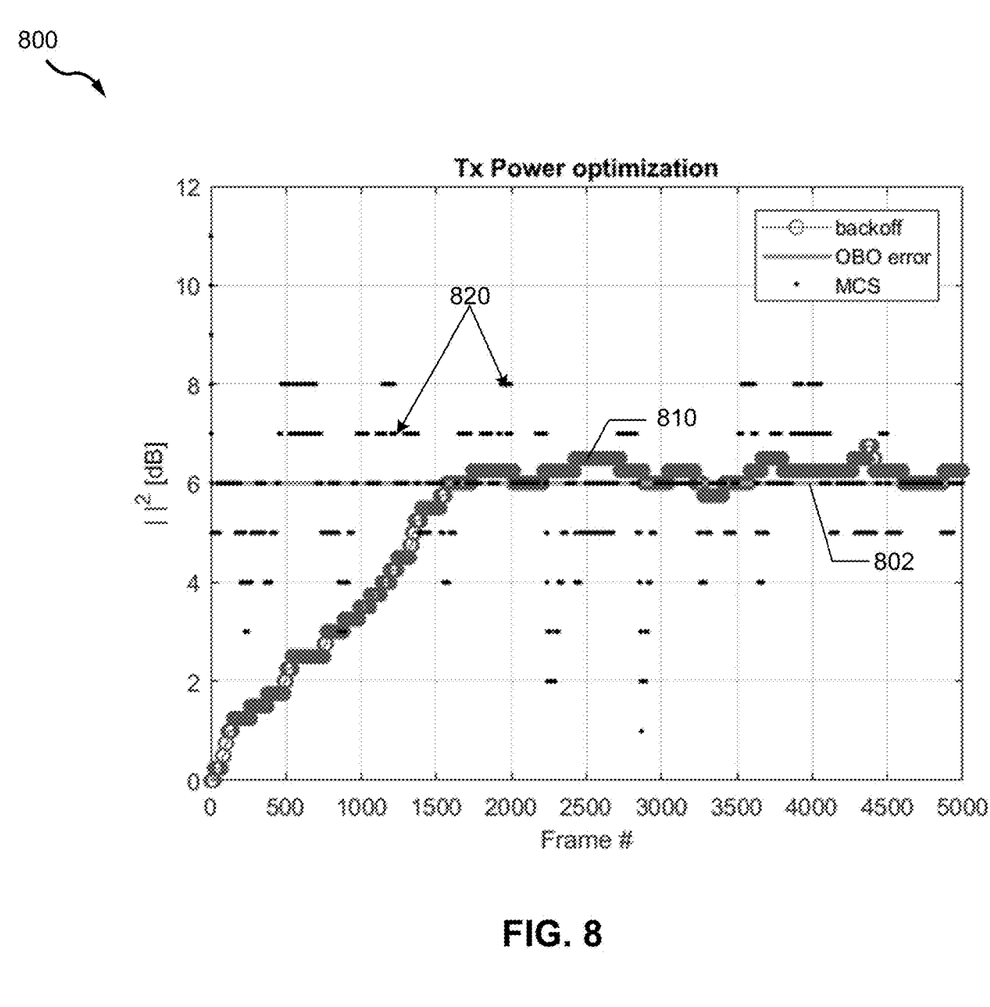
FIG. 8 is a chart illustrating an example simulation result on Tx power optimization based on a Rayleigh channel, in accordance with one or more implementations of the subject technology.

FIG. 8 is a chart illustrating an example simulation result on Tx power optimization based on a Rayleigh channel, in accordance with one or more implementations of the subject technology. The example simulation result 800 includes a plot 810 of the power backoff versus frame number. Also shown are an initial OBO error 802 at about 6 dB and MCS values 820. The Tx power is set at about 6 dB below the desired level—the initial power error. The channel attenuation varies according to the (flat) Rayleigh model. The rate-control module (e.g., 226 of FIG. 2) adapts the rate (MCS) to support communication under dynamic channel conditions. The system operates from MCS1 to MCS8 due to a severe fading factor. The probing is able to recover the 6 dB of Tx power error in spite of channel and rate variations.

Figure 9:
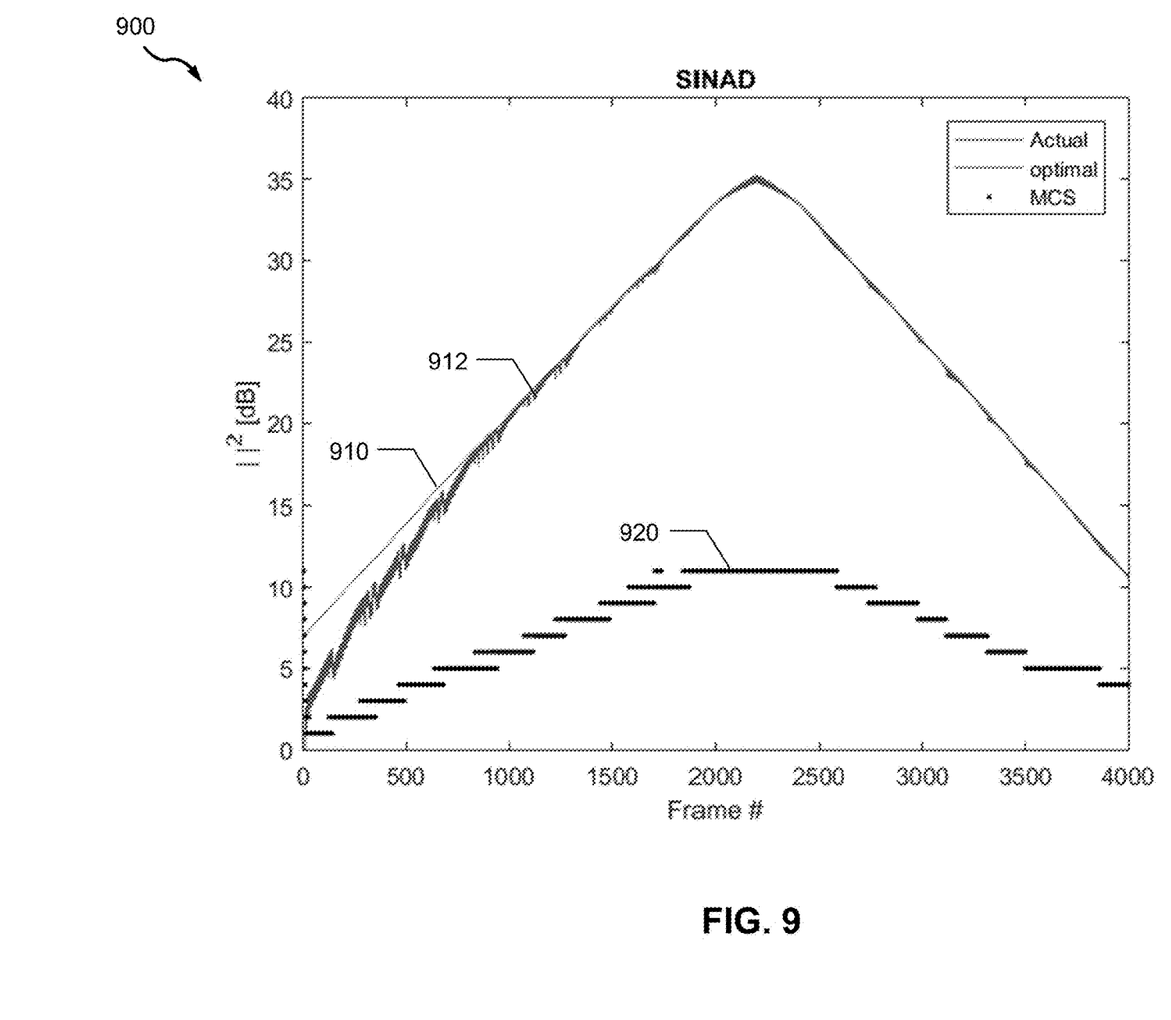
FIG. 9 is a chart illustrating an example simulation result on Tx power optimization convergence to an optimal power backoff, in accordance with one or more implementations of the subject technology.

FIG. 9 is a chart illustrating an example simulation result 900 on Tx power optimization convergence to an optimal power backoff, in accordance with one or more implementations of the subject technology. The simulation result 900 includes a plot 910 of an optimal Tx power variation, a plot 912 of the actual Tx power variation versus frame number (#) and MCS values 920. The simulation loop control (e.g., 530 of FIG. 5) is a proportional loop. The Tx power optimization converges to the optimal level starting from 6 dB error. The throughput is optimal, and the sloped channel travels from MCS1 to MCS11. The noise like spikes are the power probing of +/−0.5 dB.

Figure 10:
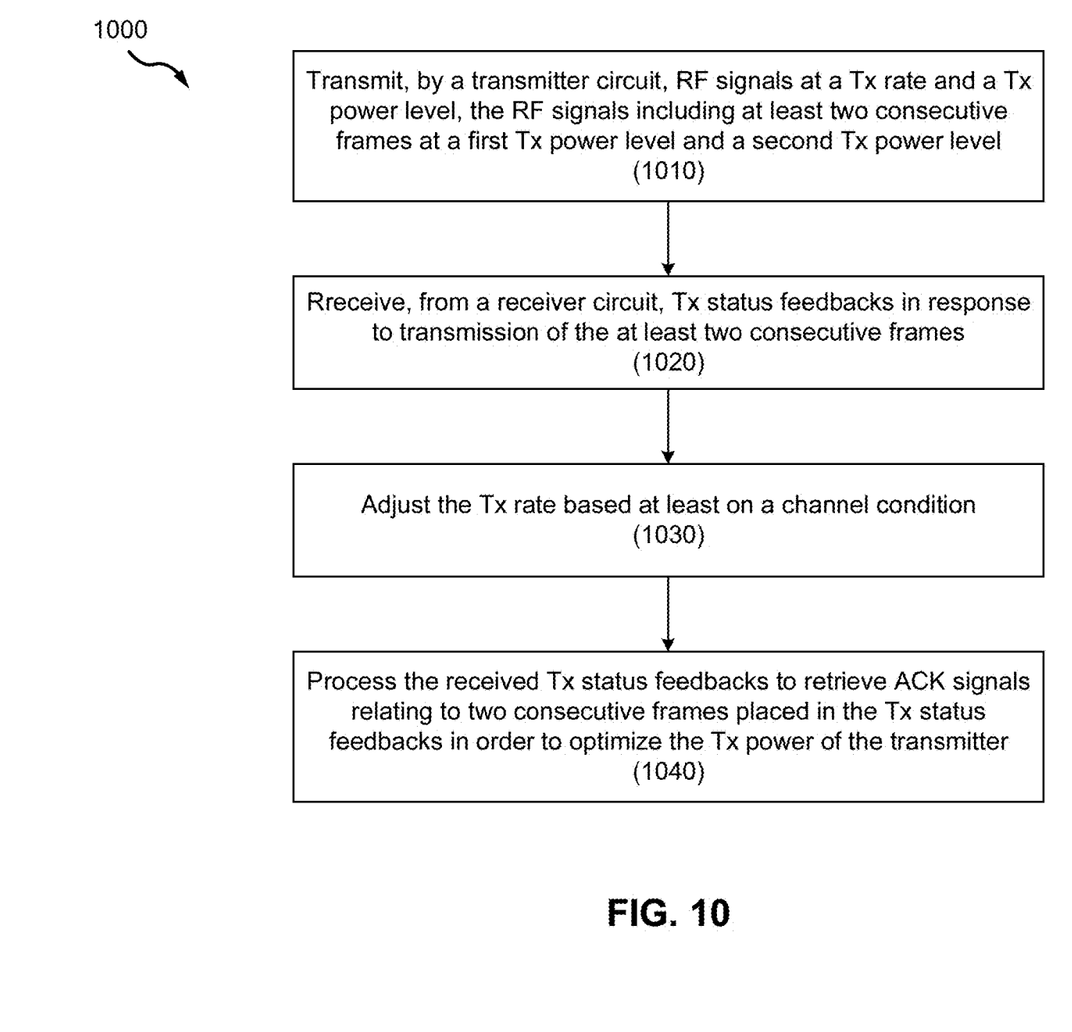
FIG. 10 is a flow diagram illustrating an example method of Tx power optimization and rate control, in accordance with one or more implementations of the subject technology.

FIG. 10 is a flow diagram illustrating an example method 1000 of Tx-power optimization and rate control, in accordance with one or more implementations of the subject technology. The method 1000 includes transmitting, by a transmitter circuit (e.g., 210 of FIG. 2), RF signals at a Tx rate and a Tx power level, the RF signals including at least two consecutive frames (e.g., 410 and 412 of FIG. 4) at a first Tx power level and a second Tx power level (1010). The method 1000 also includes receiving, from a receiver circuit (e.g., 230 of FIG. 2), Tx status feedbacks in response to transmission of at least two consecutive frames (1020). The method 1000 further includes adjusting (e.g., by 226 of FIG. 2) the Tx rate based at least on a channel condition (1030), and processing (e.g., by 224 of FIG. 2) the received Tx status feedbacks to retrieve ACK signals relating to two consecutive frames placed in the Tx status feedbacks in order to optimize the Tx power of the transmitter (1040).

Figure 11:
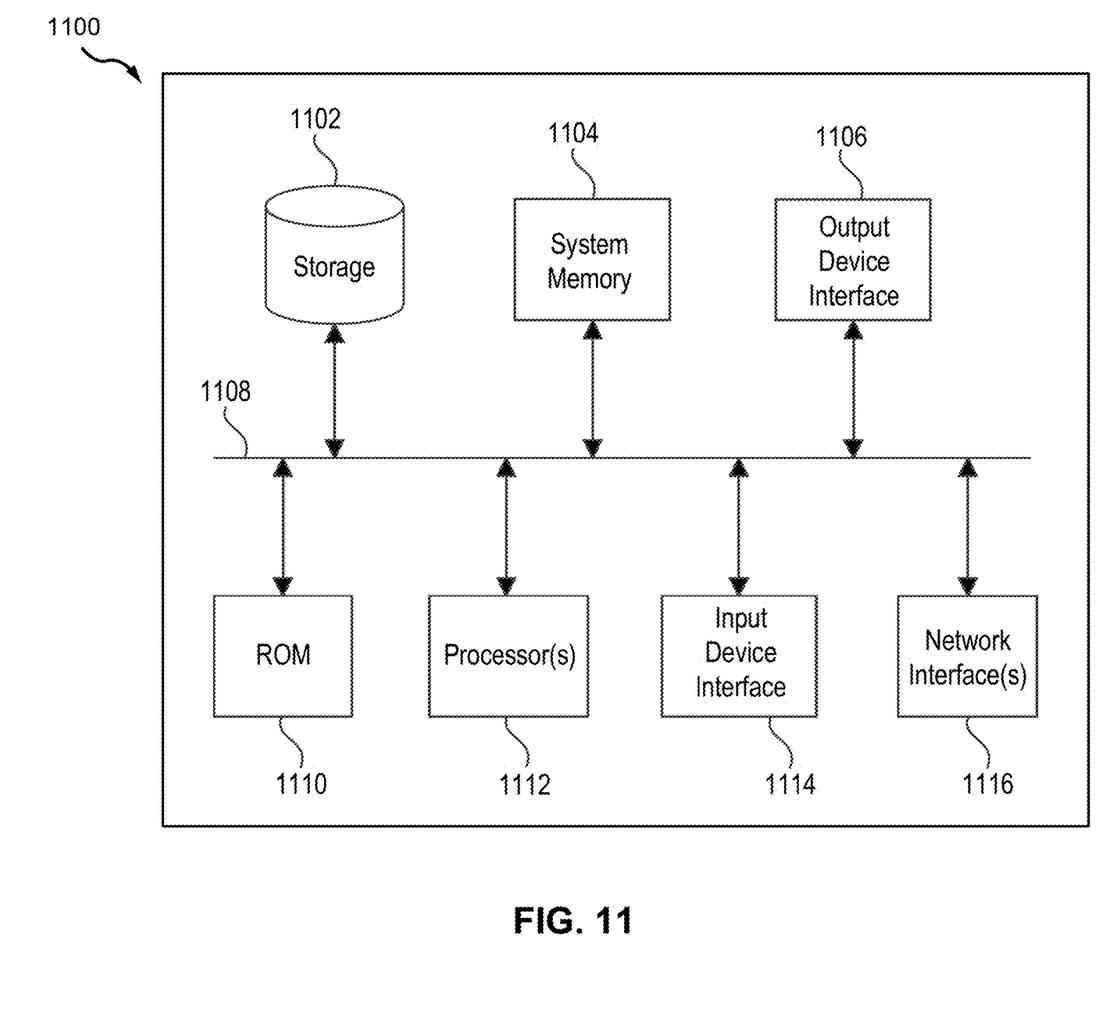
FIG. 11 conceptually illustrates an electronic system with which some aspects of the subject technology can be implemented.

FIG. 11 conceptually illustrates an electronic system with which some aspects of the subject technology can be implemented. The electronic system 1100, for example, can be a network device, a media client, an internet protocol (IP) set-top box (STB), a desktop computer, a laptop computer, a tablet computer, a server, a switch, a router, a base station, a receiver, a phone, or generally any electronic device that transmits signals over a network. Such an electronic system 1100 includes various types of computer-readable media and interfaces for various other types of computer-readable media. The electronic system 1100 includes a bus 1108, one or more processor(s) 1112, a system memory 1104, a read-only memory (ROM) 1110, a permanent storage device 1102, an input device interface 1114, an output device interface 1106 and a network interface 1116, or subsets and variations thereof.

The bus 1108 collectively represents all system, peripheral and chipset buses that communicatively connect the numerous internal devices of the electronic system 1100. In one or more implementations, the bus 1108 communicatively connects the one or more processor(s) 1112 with the ROM 1110, the system memory 1104 and the permanent storage device 1102. From these various memory units, the one or more processor(s) 1112 retrieve instructions to execute and data to process in order to execute the processes of the subject disclosure. The one or more processor(s) 1112 can be a single processor or a multicore processor in different implementations. In one or more implementations, the one or more processor(s) 1112 can implement various processes and methods of the subject technology, for example, of FIGS. 3, 5 and 6. The one or more processor(s) 1112 may also implement the functionalities of the first block 220 and 240 of FIG. 2.

The ROM 1110 stores static data and instructions that are needed by the one or more processor(s) 1112 and other modules of the electronic system. The permanent storage device 1102, on the other hand, is a read-and-write memory device. The permanent storage device 1102 is a non-volatile memory unit that stores instructions and data even when the electronic system 1100 is off. One or more implementations of the subject disclosure use a mass-storage device (such as a magnetic or optical disk and its corresponding disk drive) as the permanent storage device 1102.

Other implementations use a removable storage device (such as a floppy disk, flash drive and its corresponding disk drive) as the permanent storage device 1102. Like the permanent storage device 1102, the system memory 1104 is a read-and-write memory device. However, unlike the permanent storage device 1102, the system memory 1104 is a volatile read-and-write memory, such as random-access memory. System memory 1104 stores any of the instructions and data that the one or more processor(s) 1112 need at runtime. In one or more implementations, the processes of the subject disclosure are stored in the system memory 1104, the permanent storage device 1102 and/or the ROM 1110. From these various memory units, the one or more processor(s) 1112 retrieve instructions to execute and data to process in order to execute the processes of one or more implementations.

The bus 1108 also connects to the input device interface 1114 and the output device interface 1106. The input device interface 1114 enables a user to communicate information and select commands to the electronic system. Input devices used with the input device interface 1114 include, for example, alphanumeric keyboards and pointing devices (also called cursor control devices). The output device interface 1106 enables, for example, the display of images generated by the electronic system 1100. Output devices used with the output device interface 1106 include, for example, printers and display devices, such as a liquid crystal display (LCD), a light-emitting diode (LED) display, an organic LED display, a flexible display, a flat-panel display, a solid-state display, a projector, or any other device for outputting information. One or more implementations include devices that function as both input and output devices, such as a touchscreen. In these implementations, feedback provided to the user can be any form of sensory feedback, such as visual, or tactile feedback; and input from the user can be received in any form, including acoustic, speech, or tactile input.

Finally, as shown in FIG. 11, the bus 1108 also couples the electronic system 1100 to one or more networks (not shown) through one or more network interfaces 1116. In this manner, the computer can be a part of one or more networks of computers (such as a LAN), a wide-area network (WAN), or an intranet, or a network of networks, such as the Internet. Any or all components of the electronic system 1100 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general-purpose or special-purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device while, in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence and organization of instructions can vary significantly without varying the underlying logic, function, processing and output.

While the above discussion primarily refers to microprocessor or multicore processors that execute software, one or more implementations are performed by one or more integrated circuits, such as application-specific integrated circuits (ASICs) or field-programmable gate arrays (FPGAs). In one or more implementations, such integrated circuits execute instructions that are stored on the circuit itself.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations or one or more configurations. A phrase such as "an aspect" may refer to one or more aspects and vice versa. A phrase such as "a configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "an example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the terms "include," "have," or the like are used in the description or the claims, such terms are intended to be inclusive in a manner similar to the term "comprise," as "comprise" is interpreted when employed as a transitional word in a claim.

Those of skill in the art would appreciate that the various illustrative blocks, modules, elements, components, methods and algorithms described herein may be implemented as electronic hardware, computer software, or combinations of both. To illustrate this interchangeability of hardware and software, various illustrative blocks, modules, elements, components, methods and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. A transmit power optimization and rate-control system, the system comprising:
    a transmitter circuit including one or more power amplifiers and configured to transmit radio-frequency (RF) signals at a transmission (Tx) rate and at a current Tx power level;
    a rate-control module configured to adjust the Tx rate based at least on a channel condition;
    a probing engine configured to:
        generate a first probing frame at a first Tx power level and a second probing frame at a second Tx power level in response to a trigger;
        cause the transmitter circuit to transmit the first probing frame and the second probing frame;
        retrieve a first packet success rate (PSR) from a first acknowledgment (ACK) feedback corresponding to the first probing frame;
        retrieve a second PSR from a second ACK corresponding to the second probing frame;
        determine a difference between the first PSR and the second PSR;

filter a PSR subtraction result, the PSR subtraction result comprising the difference between the first PSR and the second PSR; and adjust, based on the filtered PSR subtraction result, the current TX power level.

2. The system of claim 1, wherein the rate control module is further configured to update the Tx rate based on the adjustment to the current Tx power level.

3. The system of claim 1, further comprising a scheduler module configured to generate the trigger.

4. The system of claim 1, wherein the first probing frame and the second probing frame are consecutive frames including a +delta ($\Delta$) frame and a -$\Delta$ frame, and wherein each of the +$\Delta$ frame and the -$\Delta$ frame is coupled with an aggregated media access control (MAC) protocol data unit (AMPDU).

5. The system of claim 1, further comprising a Tx probing detector comprising a subtraction module that determines the difference.

6. The system of claim 1, wherein adjustment of the Tx rate is achieved by limiting an error vector magnitude (EVM).

7. The system of claim 1, wherein a Tx power backoff is reflected from a previous Tx rate when a new Tx rate is selected.

8. The system of claim 1, wherein the probing engine is configured to provide an increase in the adjustment to the Tx power level by a delta based on a first condition.

9. The system of claim 8, wherein the probing engine is configured to provide a reduction in the adjustment to the Tx power level by the delta based on a second condition different from the first condition.

10. The system of claim 9, wherein a value of the delta is between 0.3 dB to 0.7 dB.

11. A processor configured to carry out instructions, the instructions comprising:
transmitting radio-frequency (RF) signals at a transmission (Tx) rate and at a current Tx power level;
transmitting a first probing frame at a first Tx power level and a second probing frame at a second Tx power level in response to a trigger;
receiving Tx status feedback in response to transmission of the first probing frame and the second probing frame;
adjusting the Tx rate based at least on a channel condition;
retrieving a first packet success rate (PSR) from an acknowledgment (ACK) signal placed in the Tx status feedback corresponding to the first probing frame;
retrieving a second PSR from an ACK signal placed in the Tx status feedback corresponding to the second probing frame;
filtering a PSR subtraction result, the PSR subtraction result comprising a difference between the first PSR and the second PSR; and
adjusting the current Tx power level based on the filtered PSR subtraction result.

12. The processor of claim 11, wherein the first probing frame and the second probing frame comprise consecutive frames.

13. The processor of claim 11, wherein the adjusting of the Tx rate is further achieved by limiting an error vector magnitude (EVM) and maximizing the link throughput.

14. The processor of claim 11, wherein the instruction executed by the processor cause the processor to provide an increase in the adjustment to the Tx power level by a delta based on a first condition.

15. The processor of claim 14, wherein the instruction executed by the processor cause the processor to provide a reduction in the adjustment to the Tx power level by the delta based on a second condition different from the first condition.

16. The processor of claim 15, wherein a value of the delta is between 0.3 dB to 0.7 dB.

17. A station for facilitating communication in a wireless local area network, the station comprising:
one or more memories comprising instructions; and
one or more processors coupled to the one or more memories, wherein the instruction executed by the one or more processors cause the one or more processors to:
determine a current transmission (Tx) power transmit a first probing frame at a first Tx power level and a second probing frame at a second Tx power level;
process a response frame indicating a Tx status feedback associated with one or more of the first probing frame and the second probing frame;
determine a channel condition using the Tx status feedback;
adjust a current Tx rate based on the channel condition;
retrieve a first packet success rate (PSR) from an acknowledge (ACK) signal placed in the Tx status feedback corresponding to the first probing frame;
retrieve a second PSR from an acknowledge (ACK) signal placed in the Tx status feedback corresponding to the second probing frame; and
perform a power-level discrimination by subtracting the second PSR from the first PSR, filtering a PSR subtraction result; and
adjust the current Tx power level based on the filtered PSR subtraction result.

18. The station of claim 17, wherein the first probing frame and the second probing frame comprise consecutive frames.

19. The station of claim 17, wherein the instruction executed by the one or more processors cause the one or more processors to provide an increase in the adjustment to the Tx power level by a delta based on a first condition.

20. The station of claim 19, wherein the instruction executed by the one or more processors cause the one or more processors to provide a reduction in the adjustment to the Tx power level by the delta based on a second condition different from the first condition.

21. The station of claim 19, wherein a value of the delta is between 0.3 dB to 0.7 dB.

* * * * *